(12) United States Patent
Wu

(10) Patent No.: US 10,026,544 B2
(45) Date of Patent: Jul. 17, 2018

(54) COMMON MODE NOISE RESTRAINER APPLICABLE TO ETHERNET

(71) Applicant: Realtek Semiconductor Corporation, Hsinchu (TW)

(72) Inventor: Chien-Ming Wu, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 19 days.

(21) Appl. No.: 15/244,900

(22) Filed: Aug. 23, 2016

(65) Prior Publication Data

US 2017/0063321 A1 Mar. 2, 2017

(30) Foreign Application Priority Data

Sep. 2, 2015 (TW) .............................. 104129033 A

(51) Int. Cl.
| | |
|---|---|
| *H04B 3/28* | (2006.01) |
| *H01F 27/29* | (2006.01) |
| *H01F 38/16* | (2006.01) |
| *H01F 27/33* | (2006.01) |
| *H03H 7/42* | (2006.01) |

(52) U.S. Cl.
CPC ............. *H01F 27/29* (2013.01); *H01F 27/33* (2013.01); *H01F 38/16* (2013.01); *H03H 7/427* (2013.01)

(58) Field of Classification Search
CPC .......... H01F 27/29; H01F 27/33; H01F 38/16; H03H 7/427; H03H 7/0115; H01P 5/10
See application file for complete search history.

(56) References Cited

U.S. PATENT DOCUMENTS 7,696,836 B2 * 4/2010 Nguyen ................... H01P 5/10
333/177
8,050,399 B2 11/2011 Tsai et al.
(Continued)

FOREIGN PATENT DOCUMENTS

| CN | 102237617 | 2/2014 |
| CN | 104104350 | 10/2014 |

OTHER PUBLICATIONS

Office Action letter of the counterpart Taiwan application 104129033 dated Sep. 7, 2016.
(Continued)

*Primary Examiner* — Robert J Pascal
*Assistant Examiner* — Kimberly Glenn
(74) *Attorney, Agent, or Firm* — WPAT, PC

(57) ABSTRACT

The present invention discloses a common mode noise restrainer applicable to Ethernet, comprising: a circuit side configured to connect with an integrated circuit; a cable side configured to connect with a cable; a plurality of transformers set between the circuit side and the cable side; and a plurality of common mode chokes composed of a first part of the common mode chokes and a second part of the common mode chokes in which the first part of the common mode chokes is set between the circuit side and the plurality of transformers and the second part of the common mode chokes is set between the cable side and the plurality of transformers while the one or more transformer(s) connected with the first part of the common mode chokes are not identical to the one or more transformer(s) connected with the second part of the common mode chokes.

16 Claims, 7 Drawing Sheets

(56) References Cited

U.S. PATENT DOCUMENTS

2014/0306781 A1   10/2014  Zhang
2015/0200644 A1    7/2015  Ao-Ieong et al.

OTHER PUBLICATIONS

English abstract translation of CN102237617.
CN104104350 is also published as US20140306781.
English abstract translation of the Office Action letter of the counterpart Taiwan application 104129033 dated Sep. 7, 2016.

* cited by examiner

COMMON MODE NOISE RESTRAINER APPLICABLE TO ETHERNET

BACKGROUND OF THE INVENTION

1. Field of the Invention

The present invention relates to noise reduction, especially to common mode noise reduction.

2. Description of Related Art

In view of that an unshielded twisted pair cable for Ethernet transmission is subject to common mode noise and the consequent electromagnetic interference (EMI), a common mode choke is widely used for EMI reduction. A general Ethernet integrated circuit is coupled to a cable connector through a transformer, and a known art for EMI reduction is to set a common mode choke on each pair of wires between the said integrated circuit and transformer, set a common mode choke on each pair of wires between the transformer and the said cable connector, or set a common mode choke on each pair of wires at the both sides of the transformer. However, this kind of solution cannot achieve optimal EMI reduction and/or takes a lot of circuit area and cost. Therefore, the industry field looks forward to a better option.

People who are interested in the known arts may refer to the following documents:
(1) the document of U.S. Pat. No. 8,050,399; and
(2) the document of US Pat. Pub. No. 2015/0200644 A1.

SUMMARY OF THE INVENTION

An object of the present invention is to provide a common mode noise restrainer applicable to Ethernet for improvements over the prior art.

The present invention discloses a common mode noise restrainer applicable to Ethernet. An embodiment of such restrainer comprises: a circuit side configured to connect with an integrated circuit; a cable side configured to connect with a cable; a plurality of transformers set between the circuit side and the cable side; and a plurality of common mode chokes composed of a first part of the common mode chokes and a second part of the common mode chokes, in which the first part of the common mode chokes is set between the circuit side and the plurality of transformers and the second part of the common mode chokes is set between the cable side and the plurality of transformers while the one or more transformer(s) connected with the first part of the common mode chokes is/are not identical to the one or more transformer(s) connected with the second part of the common mode chokes. The said first part of the common mode chokes includes at least one of the common mode chokes, and the said second part of the common mode chokes includes at least one of the common mode chokes.

Another embodiment of the aforementioned common mode noise restrainer applicable to Ethernet comprises: a circuit side configured to connect with an integrated circuit; a cable side configured to connect with a cable, in which the cable side is coupled with the circuit side through four pairs of wires composed of a first pair of wires, a second pair of wires, a third pair of wires and a fourth pair of wires while the second and third pairs of wires are set between the first and fourth pairs of wires; a plurality of transformers set between the circuit side and the cable side; and a plurality of cable-side common mode chokes set between the cable side and the plurality of transformers and coupled with at least the second and third pairs of wires among the four pairs of wires. In addition, N circuit-side common mode choke(s) is/are set between the circuit side and the plurality of transformers while N is an integer not less than zero; if N is zero, at least one pair of wires among the four pairs of wires is coupled with none of the cable-side common mode chokes; if N is greater than zero, the one or more transformer(s) coupled with the cable-side common mode chokes is/are not identical to the one or more transformer(s) coupled with the circuit-side common mode choke(s), or at least one pair of wires among the four pairs of wires is coupled with none of the cable-side and circuit-side common mode chokes.

A further embodiment of the aforementioned common mode noise restrainer applicable to Ethernet comprises: a circuit side configured to connect with an integrated circuit; a cable side configured to connect with a cable, in which the cable side is coupled with the circuit side through four pairs of wires composed of a first pair of wires, a second pair of wires, a third pair of wires and a fourth pair of wires while the second and third pairs of wires are set between the first and fourth pairs of wires; a plurality of transformers set between the circuit side and the cable side; and a plurality of circuit-side common mode chokes set between the circuit side and the plurality of transformers and coupled with at least the second and third pairs of wires among the four pairs of wires. In addition, M cable-side common mode choke(s) is/are set between the cable side and the plurality of transformers while M is an integer not less than zero; if M is zero, at least one pair of wires among the four pairs of wires is coupled with none of the circuit-side common mode chokes; if M is greater than zero, the one or more transformer(s) coupled with the circuit-side common mode chokes is not identical to the one or more transformer(s) coupled with the cable-side common mode choke(s), or at least one pair of wires among the four pairs of wires is coupled with none of the circuit-side and cable-side common mode chokes.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in the specification, such term should be explained accordingly.

The present invention comprises a common mode noise restrainer applicable to Ethernet or other configurations requiring common mode noise reduction. On account of that some element of the common mode noise restrainer could be known, the detail of such element will be omitted provided that this omission has little to do with the written description and enablement requirements. If an implementation derived from one or more of the embodiments in the following description is practicable, a person of ordinary skill in the art can selectively make use of some or all of the features in one embodiment or selectively make use of the combination of some or all features in several embodiments to have the implementation come true, so as to fulfill the flexibility of carrying out the present invention.

Figure 1:
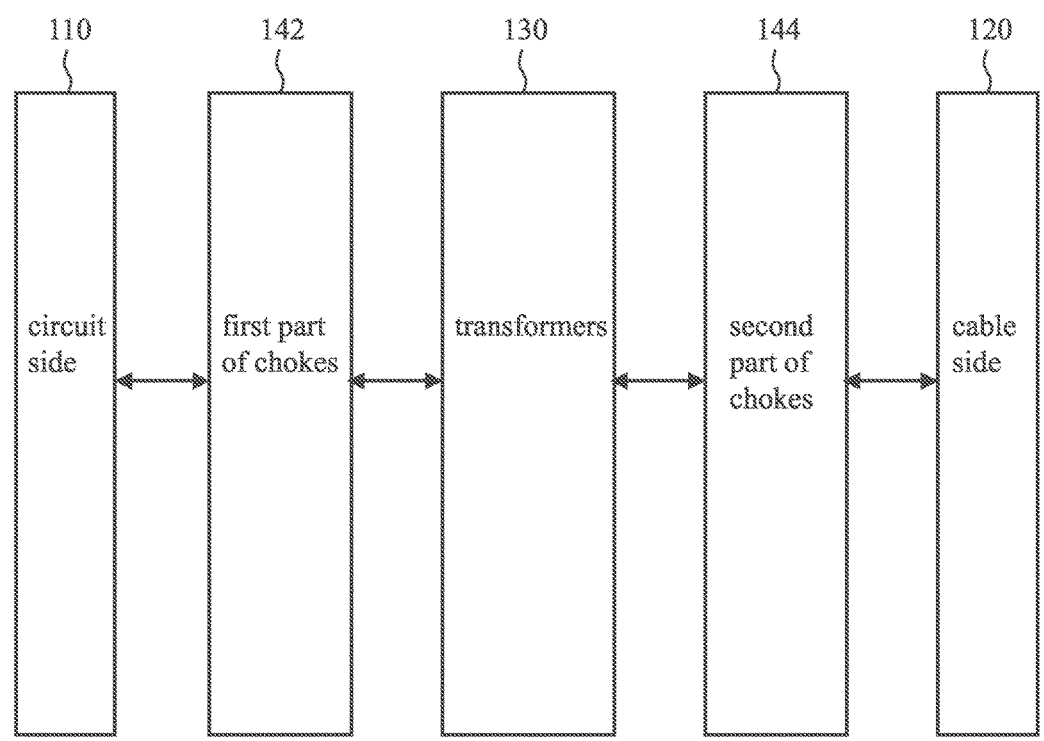
FIG. 1 illustrates an embodiment of the common mode noise restrainer of the present invention.

Please refer to FIG. 1 which illustrates an embodiment of the common mode noise restrainer of the present invention. In this embodiment, the common mode noise restrainer 100 includes: a circuit side 110 configured to connect with an integrated circuit (e.g., an Ethernet integrated circuit); a cable side 120 configured to connect with a cable (e.g., an Ethernet cable); a plurality of transformers 130 set between the circuit side 110 and the cable side 120; and a plurality of common mode chokes composed of a first part 142 of the common mode chokes and a second part 144 of the common mode chokes, in which the first part 142 is set between the circuit side 110 and the plurality of transformers 130 and the second part 144 is set between the cable side 120 and the plurality of transformers 130. It should be noted that the one or more transformer(s) 130 connected with the first part 142 is/are not identical to the one or more transformer(s) 130 connected with the second part 144, which means that the first part 142 and the second part 144 are set at different sides of the plurality of transformers 130 respectively and the arrangements of the first part 142 and the second part 144 are not symmetric.

On the basis of the above, an instance is given below. When this embodiment is applied to Ethernet, the circuit side 110 and the cable side 120 are connected through transmission lines (e.g., four pairs of wires) compatible to the transmission of an Ethernet cable (e.g., an unshielded twisted pair cable). Take four pairs of wires for example; the aforementioned first part 142 of the common mode chokes is coupled with X pair(s) of wires (e.g., the first pair of wires 210 and the fourth pair of wires 240 as shown in FIG. 2) among the four pairs of wires, and the second part 144 of the common mode chokes is coupled with at least one pair of wires (e.g., the second pair of wires 220 and the third pair of wires 230 as shown in FIG. 2) among the four pairs of wires excluding the X pair(s) of wires, in which X is a positive integer.

Figure 2:
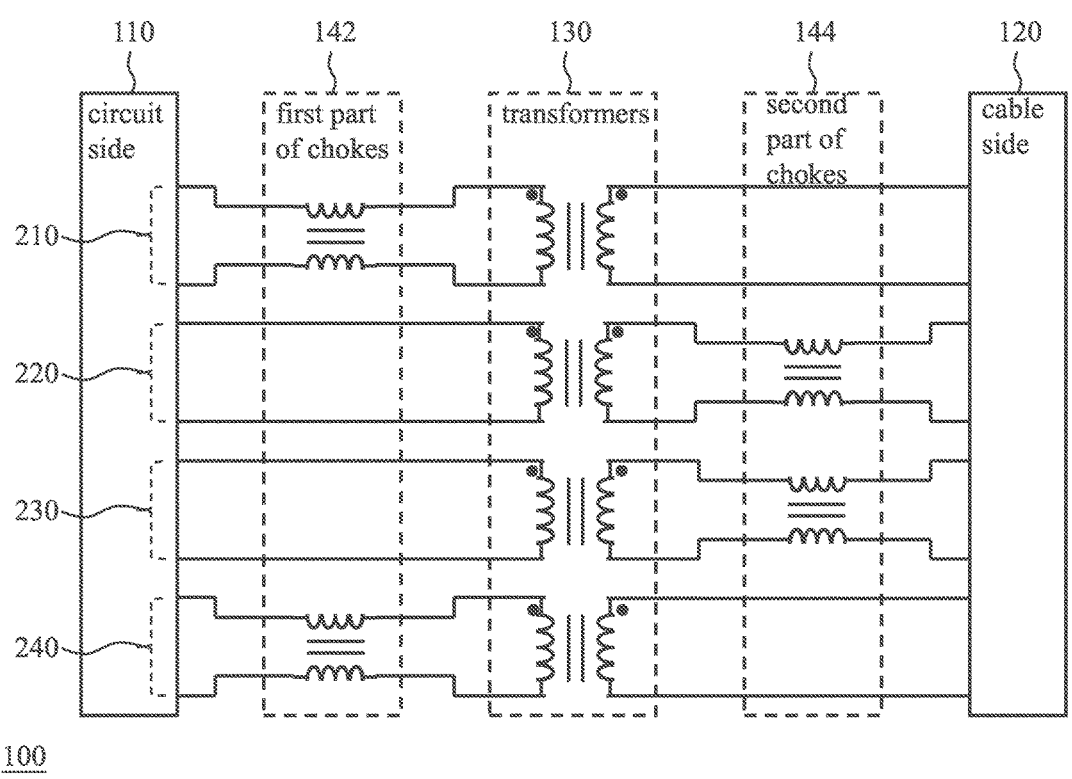
FIG. 2 illustrates an exemplary implementation of the common mode noise restrainer of FIG. 1.

Please refer to FIG. 2 which illustrates an exemplary implementation of the aforementioned instance. As it is shown in FIG. 2, the circuit side 110 and the cable side 120 are coupled with each other through four pairs of wires and transformers 130. The four pairs of wires are composed of a first pair of wires 210, a second pair of wires 220, a third pair of wires 230 and a fourth pair of wires 240, in which the second pair of wires 220 and the third pair of wires 230 are disposed between the first pair of wires 210 and the fourth pair of wires 240. In addition, regarding this implementation, the frequency response characteristics of the first pair of wires 210 and the fourth pair of wires 240 are different from the frequency response characteristics of the second pair of wires 220 and the third pair of wires 230 (e.g., the first and fourth pairs of wires having higher signal energy in response to the signal frequency 125 MHz and having lower signal energy in response to the signal frequency 60~90 MHz, while the second and third pairs of wires having lower signal energy in response to the signal frequency 125 MHz and having higher signal energy in response to the signal frequency 60~90 MHz), in which the frequency response characteristics are related to electromagnetic interference (EMI). Therefore, this implementation couples the first part 142 of the common mode chokes with the first pair of wires 210 and the fourth pair of wires 240 and sets the first part 142 between the circuit side 110 and the transformers 130, and couples the second part 144 of the common mode chokes with the second pair of wires 220 and the third pair of wires 230 and sets the second part 144 between the cable side 120 and the transformers 130. Accordingly, an adaptive common mode noise reduction effect is accomplished. It should be noted that the aforementioned frequency response characteristics of the four pairs of wires are sustained under a specific or given condition, and may change under other conditions. Those of ordinary skill in the art can derive the frequency response characteristic of each pair of wires from the condition of real circuit design or experiment/simulation results, and then determine the arrangement of common mode chokes in accordance with the teaching of the present disclosure and the characteristics they found.

Please note that in the aforementioned embodiment the number of common mode choke(s) of the first part 142 could be the same as or different from the number of common mode choke(s) of the second part 144, and the types or inductances of the common mode chokes could be similar or distinct. In brief, as long as the first part 142 and the second part 144 are disposed at the different two sides of the transformers 130 respectively and asymmetric in arrangement, all kinds of modification can be introduced into this embodiment.

Figure 3:
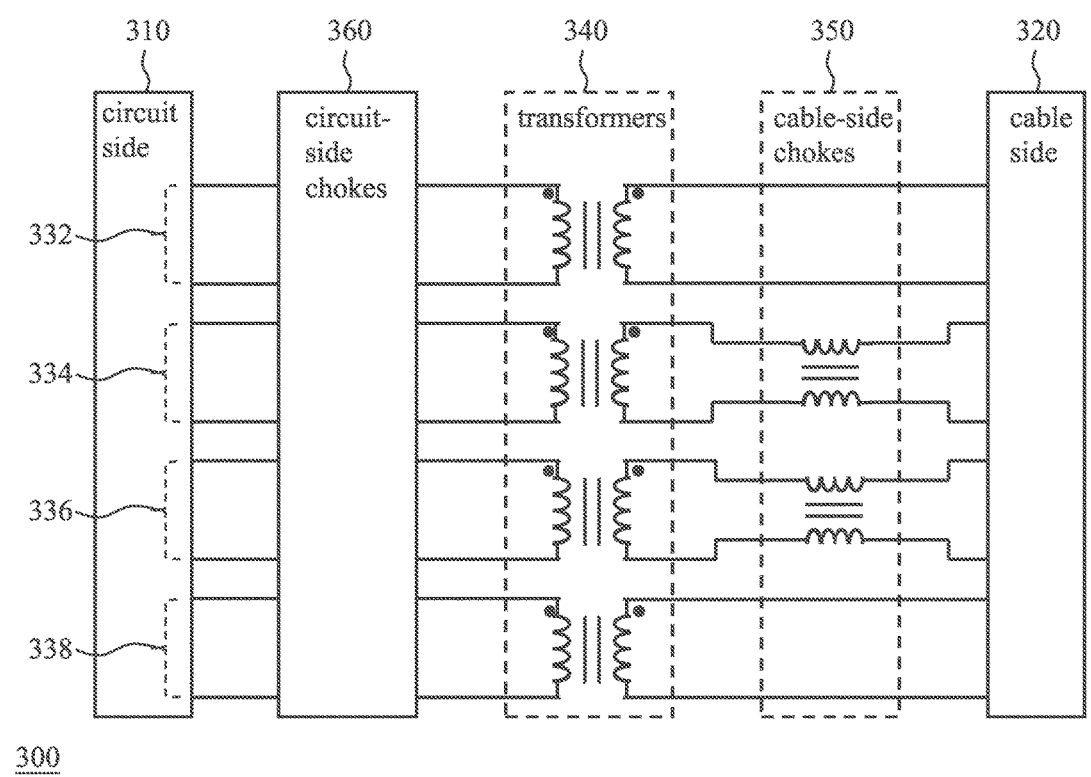
FIG. 3 illustrates another embodiment of the common mode noise restrainer of the present invention.

Please refer to FIG. 3 which illustrates another embodiment of the common mode noise restrainer of the present invention. As it is shown in FIG. 3, the common mode noise restrainer 300 includes: a circuit side 310 configured to connect with an integrated circuit; a cable side 320 configured to connect with a cable, in which the cable side 320 is coupled with the circuit side 310 through four pairs of wires composed of a first pair of wires 332, a second pair of wires 334, a third pair of wires 336 and a fourth pair of wires 338 while the second and third pairs of wires 334, 336 are set between the first and fourth pairs of wires 332, 338; a plurality of transformers 340 set between the circuit side 310 and the cable side 320; and a plurality of cable-side common mode chokes 350 set between the cable side 320 and the plurality of transformers 340 and coupled with at least the second and third pairs of wires 334, 336 among the four pairs of wires. In addition, N circuit-side common mode choke(s) 360 is/are set between the circuit side 310 and the plurality of transformers 340 while N is an integer not less than zero; if N is zero, at least one pair of wires among the four pairs of wires is coupled with none of the cable-side common mode chokes 350; if N is greater than zero, the one or more transformer(s) 340 coupled with the cable-side common mode chokes 350 is/are not identical to the one or more transformer(s) 340 coupled with the circuit-side common mode choke(s) 360, or at least one pair of wires among the four pairs of wires is coupled with none of the cable-side and circuit-side common mode chokes 350, 360. In other words, in this embodiment, the cable-side common mode chokes 350 should be connected with the second pair of wires 334 and the third pair of wires 336 and set between the cable side 320 and the transformers 340 while none of the common mode chokes is set between the circuit side 310 and the transformers 340 (which implies that N is zero and at least one pair of wires among the four pairs of wires is coupled with none of the cable-side common mode chokes 350), or the cable-side common mode chokes 350 and the circuit-side common mode choke(s) 360 are set at the different two sides respectively and asymmetric in arrangement, or the cable-side common mode chokes 350 and the circuit-side common mode choke(s) 360 are respectively set at the different two sides of the transformers 340 in a symmetric or asymmetric manner while at least one pair of wires is coupled with none of the cable-side and circuit-side common mode chokes 350, 360.

Figure 4:
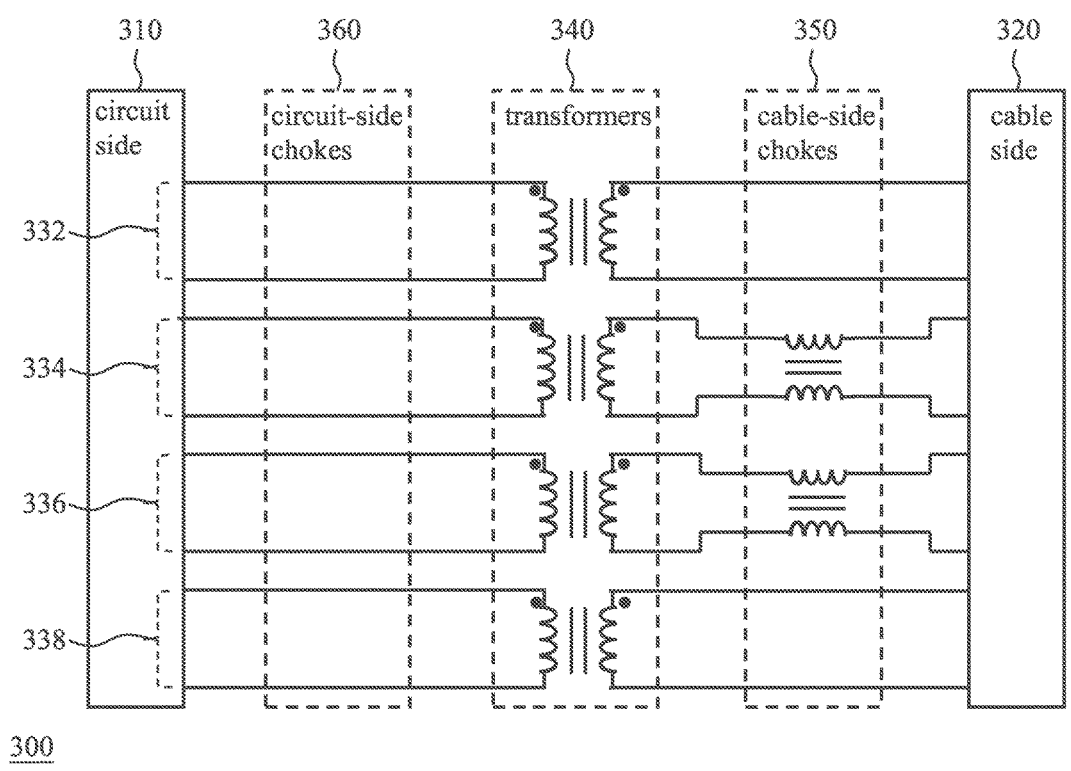
FIG. 4 illustrates an exemplary implementation of the common mode noise restrainer of FIG. 3.
Figure 5:
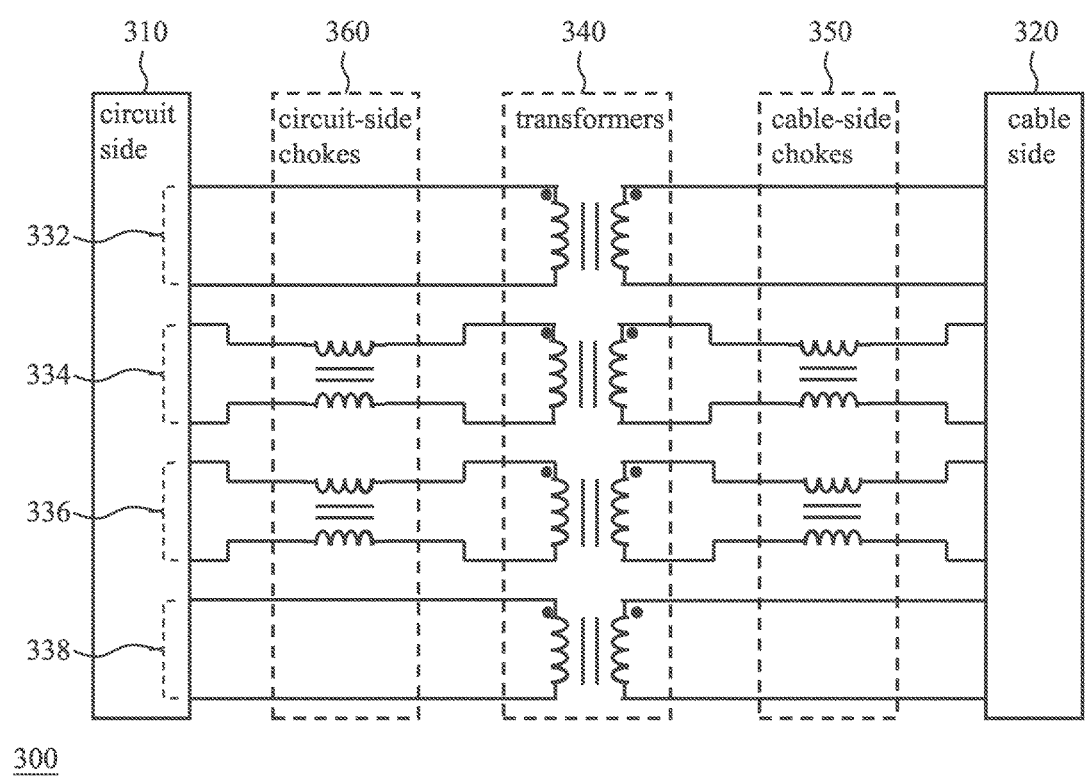
FIG. 5 illustrates another exemplary implementation of the common mode noise restrainer of FIG. 3.
Figure 6:
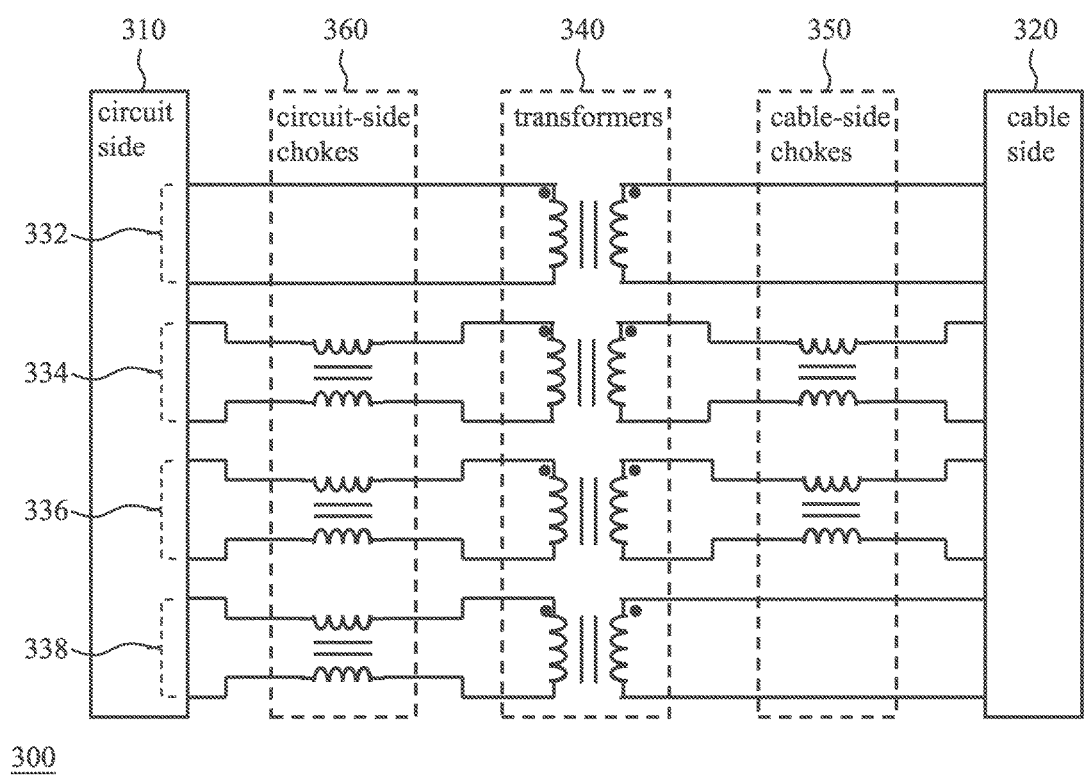
FIG. 6 illustrates yet another exemplary implementation of the common mode noise restrainer of FIG. 3.

On the basis of the above, for instance, this embodiment may set no circuit-side common mode choke 360 (i.e., N is zero) as shown in FIG. 4; for another instance, this embodiment may make the arrangements of the circuit-side common mode choke(s) 360 and the cable-side common mode chokes 350 asymmetric (as shown in FIG. 2); for yet another instance, this embodiment may make the arrangements of the circuit-side common mode choke(s) 360 and the cable-side common mode chokes 350 symmetric (as shown in FIG. 5), while at least one pair of wires (e.g., the first and fourth pairs of wires 332, 338) is coupled with none of the cable-side and circuit-side common mode chokes 350, 360; for yet another instance, this embodiment may make the arrangements of the circuit-side common mode choke(s) 360 and the cable-side common mode chokes 350 asymmetric as shown in FIG. 6, while at least one pair of wires (e.g., the first pair of wires 332) is coupled with none of the cable-side and circuit-side common mode chokes 350, 360.

Similarly, the numbers and arrangements of the cable-side common mode chokes 350 and the circuit-side common mode choke(s) 360 could be determined by those of ordinary skill in the art in light of the condition of real circuit design, experiment/simulation results and the teaching of the present invention. For instance, the numbers of the cable-side and circuit-side common mode chokes 350, 360 could be identical or different, and the types or inductances of the cable-side and circuit-side common mode chokes 350, 360 could be similar or distinct.

Figure 7:
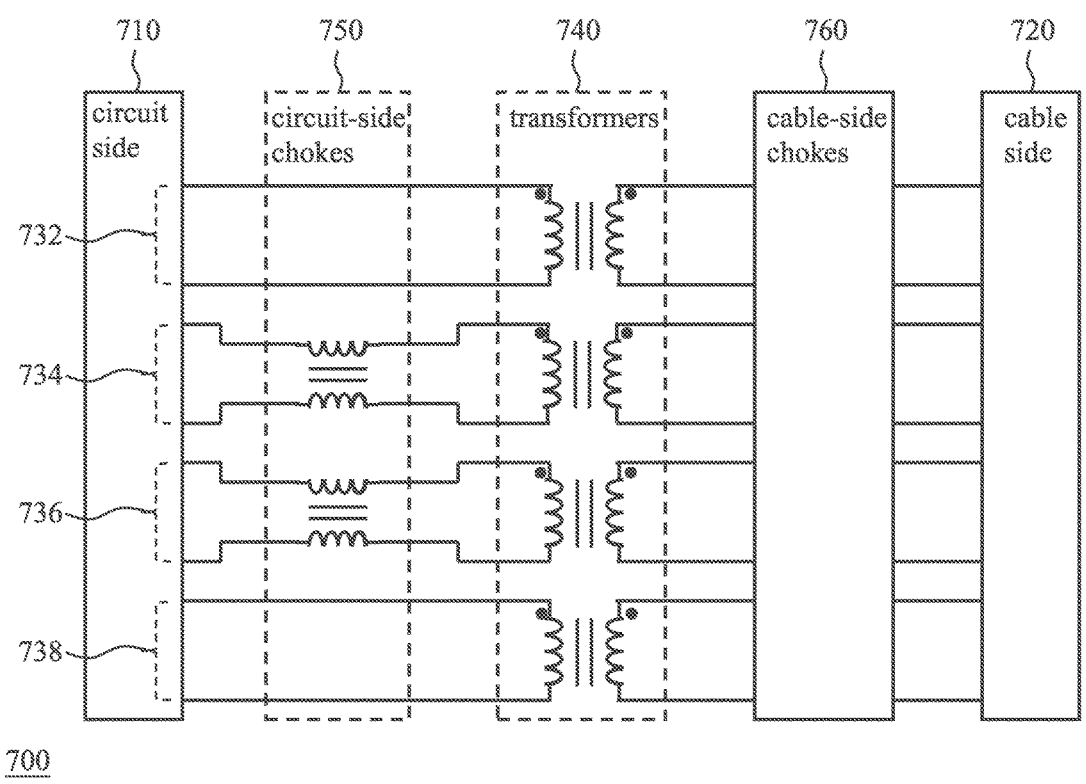
FIG. 7 illustrates a further embodiment of the common mode noise restrainer of the present invention.

Please refer to FIG. 7 which illustrates a further embodiment of the common mode noise restrainer of the present invention. As it is shown in FIG. 7, the common mode noise restrainer 700 includes: a circuit side 710 configured to connect with an integrated circuit; a cable side 720 configured to connect with a cable, in which the cable side 720 is coupled with the circuit side 710 through four pairs of wires composed of a first pair of wires 732, a second pair of wires 734, a third pair of wires 736 and a fourth pair of wires 738 while the second and third pairs of wires 734, 736 are set between the first and fourth pairs of wires 732, 738; a plurality of transformers 740 set between the circuit side 710 and the cable side 720; and a plurality of circuit-side common mode chokes 750 set between the circuit side 710 and the plurality of transformers 740 and coupled with at least the second and third pairs of wires 734, 736 among the four pairs of wires. In addition, M cable-side common mode choke(s) 760 is/are set between the cable side 720 and the plurality of transformers 740 while M is an integer not less than zero; if M is zero, at least one pair of wires among the four pairs of wires is coupled with none of the circuit-side common mode chokes 750; if M is greater than zero, the one or more transformer(s) 740 coupled with the circuit-side common mode chokes 750 is not identical to the one or more transformer(s) 740 coupled with the cable-side common mode choke(s) 760, or at least one pair of wires among the four pairs of wires is coupled with none of the circuit-side and cable-side common mode chokes 750, 760. The major difference between this embodiment and the embodiment of FIG. 3 is that the cable-side common mode choke(s) 760 is/are not required while the circuit-side common chokes 750 are required, connected with the second and third pairs of wires 734, 736 and set between the circuit side 710 and the transformers 740. The features of one among the two embodiments are applicable to the other one embodiment.

Since those of ordinary skill in the art can appreciate the detail and modification of each embodiment in this specification by referring to the disclosure of all embodiments, which means that the features of any embodiment in this specification can be applied to the other embodiments in a reasonable way, repeated and redundant description is therefore omitted provided that the remaining disclosure is still enough for understanding and enablement. Please note that the shape, size, and ratio of any element in the figures of this specification are just exemplary for understanding, not for limiting the scope of the present invention.

In summary, the common mode noise restrainer of the present invention is applicable to Ethernet or other configurations requiring common mode noise reduction, and includes at least one of the following characteristics: common mode chokes are respectively disposed at the different two sides of transformers in the manner of asymmetry; common mode chokes are respectively set at the different two sides of transformers while at least one pair of wires is connected with none of the common mode chokes; and common mode choke(s) is/are set at only one side of transformers while at least one pair of wires is connected with none of the common mode choke(s). With the above features, the present invention sets common mode chokes adaptively and/or optimally, and prevents a configuration from using too many common mode chokes for cost saving.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A common mode noise restrainer applicable to Ethernet, comprising:
a circuit side configured to connect with an integrated circuit;
a cable side configured to connect with a cable;
a plurality of transformers set between the circuit side and the cable side; and
a plurality of common mode chokes composed of a first part of the common mode chokes and a second part of the common mode chokes, in which the first part of the common mode chokes is set between the circuit side and the plurality of transformers and the second part of the common mode chokes is set between the cable side and the plurality of transformers while one or more first transformer(s) of the plurality of transformers that is/are connected with the first part of the common mode chokes is/are not identical to one or more second transformer(s) of the plurality of transformers that is/are connected with the second part of the common mode chokes,
wherein the first part of the common mode chokes includes at least one of the common mode chokes and the second part of the common mode chokes includes at least one of the common mode chokes.

2. The common mode noise restrainer of claim 1, wherein the circuit side are coupled with the cable side through four pairs of wires, the first part of the common mode chokes is coupled with X pair(s) among the four pairs of wires, the second part of the common mode chokes is coupled with at least one pair of wires among the four pairs of wires excluding the X pair(s) of wires, and X is a positive integer.

3. The common mode noise restrainer of claim 2, wherein the first part of the common mode chokes is coupled with two pairs of wires among the four pairs of wires and the second part of the common mode chokes is coupled with the rest two pairs of wires among the four pairs of wires.

4. The common mode noise restrainer of claim 3, wherein the four pairs of wires are composed of a first pair of wires, a second pair of wires, a third pair of wires and a fourth pair of wires, the second and third pairs of wires are set between the first and fourth pairs of wires, the first part of the common mode chokes is coupled with the first and fourth pairs of wires and set between the circuit side and the plurality of transformers, and the second part of the common mode chokes is coupled with the second and third pairs of wires and set between the cable side and the plurality of transformers.

5. The common mode noise restrainer of claim 1, wherein the number of chokes of the first part of the common mode chokes is the same as the number of chokes of the second part of the common mode chokes.

6. The common mode noise restrainer of claim 1, wherein the number of chokes of the first part of the common mode chokes is different from the number of chokes of the second part of the common mode chokes.

7. A common mode noise restrainer applicable to Ethernet, comprising:
   a circuit side configured to connect with an integrated circuit;
   a cable side configured to connect with a cable, in which the cable side is coupled with the circuit side through four pairs of wires composed of a first pair of wires, a second pair of wires, a third pair of wires and a fourth pair of wires while the second and third pairs of wires are set between the first and fourth pairs of wires;
   a plurality of transformers set between the circuit side and the cable side; and
   a plurality of cable-side common mode chokes set between the cable side and the plurality of transformers and coupled with at least the second and third pairs of wires among the four pairs of wires,
   wherein N circuit-side common mode choke(s) is/are set between the circuit side and the plurality of transformers while N is an integer not less than zero; if N is zero, at least one pair of wires among the four pairs of wires is coupled with none of the cable-side common mode chokes; and if N is greater than zero, one or more cable-side transformer(s) of the plurality of transformers that is/are coupled with the cable-side common mode chokes is/are not identical to one or more circuit-side transformer(s) of the plurality of transformers that is/are coupled with the circuit-side common mode choke(s) or at least one pair of wires among the four pairs of wires is coupled with none of the cable-side and circuit-side common mode chokes.

8. The common mode noise restrainer of claim 7, wherein the N circuit-side common mode choke(s) is/are coupled with at least the first and fourth pairs of wires among the four pairs of wires.

9. The common mode noise restrainer of claim 7, wherein the number of the cable-side common mode chokes is different from the number of the circuit-side common mode choke(s).

10. The common mode noise restrainer of claim 7, wherein the number of the cable-side common mode chokes is the same as the number of the circuit-side common mode choke(s).

11. The common mode noise restrainer of claim 7, wherein the number of the N circuit-side common mode choke(s) is different from the number of the cable-side common mode chokes.

12. The common mode noise restrainer of claim 7, wherein the number of the N circuit-side common mode chokes is the same as the number of the cable-side common mode chokes.

13. A common mode noise restrainer applicable to Ethernet, comprising:
    a circuit side configured to connect with an integrated circuit;
    a cable side configured to connect with a cable, in which the cable side is coupled with the circuit side through four pairs of wires composed of a first pair of wires, a second pair of wires, a third pair of wires and a fourth pair of wires while the second and third pairs of wires are set between the first and fourth pairs of wires;
    a plurality of transformers set between the circuit side and the cable side; and
    a plurality of circuit-side common mode chokes set between the circuit side and the plurality of transformers and coupled with at least the second and third pairs of wires among the four pairs of wires,
    wherein M cable-side common mode choke(s) is/are set between the cable side and the plurality of transformers while M is an integer not less than zero; if M is zero, at least one pair of wires among the four pairs of wires is coupled with none of the circuit-side common mode chokes; and if M is greater than zero, one or more circuit-side transformer(s) of the plurality of transformers that is/are coupled with the circuit-side common mode chokes is/are not identical to one or more cable-side transformer(s) of the plurality of transformers that is/are coupled with the cable-side common mode choke(s) or at least one pair of wires among the four pairs of wires is coupled with none of the circuit-side and cable-side common mode chokes.

14. The common mode noise restrainer of claim 13, wherein the M cable-side common mode choke(s) is/are coupled with at least the first and fourth pairs of wires among the four pairs of wires.

15. The common mode noise restrainer of claim 13, wherein the number of the circuit-side common mode chokes is different from the number of the M cable-side common mode choke(s).

16. The common mode noise restrainer of claim 13, wherein the number of the circuit-side common mode chokes is the same as the number of the M cable-side common mode chokes.

* * * * *